(12) United States Patent
Joseph et al.

(10) Patent No.: US 6,590,212 B1
(45) Date of Patent: Jul. 8, 2003

(54) MICROELECTROMECHANICAL SYSTEM ASSEMBLY AND TESTING DEVICE

(76) Inventors: Brian E. Joseph, 18 Lynwood Ave., Wheeling, WV (US) 26003; Elizabeth N. Kraftician, 18 Lynwood Ave., Wheeling, WV (US) 26003

( * ) Notice: Subject to any disclaimer, the term of this patent is extended or adjusted under 35 U.S.C. 154(b) by 0 days.

(21) Appl. No.: 10/241,023

(22) Filed: Sep. 11, 2002

Related U.S. Application Data

(63) Continuation-in-part of application No. 09/897,304, filed on Jul. 2, 2001.

(51) Int. Cl.[7] .................................................. G21K 7/00
(52) U.S. Cl. ...................... 250/311; 250/306; 250/307; 250/310; 73/847
(58) Field of Search ................................. 250/306, 307, 250/310, 311; 73/842

(56) References Cited

U.S. PATENT DOCUMENTS 5,559,329 A * 9/1996 Joseph et al. ............... 250/306
6,088,194 A * 7/2000 Imaino et al. ............. 360/294.3

OTHER PUBLICATIONS

MEMS design, fabrication, characterization, and packaging: May 30–Jun 1, 2001, Edinburgh, UK/Uwe F.W. Behringer, Deepak G. Uttamchandani, chairs/editors; sponsored by SPIE—the International Society for Optical Engineering.*

* cited by examiner

*Primary Examiner*—John R. Lee
*Assistant Examiner*—Erin-Michael Gill

(57) ABSTRACT

A novel MEMS assembly and testing system that utilizes a scanning electron microscope (SEM) typically having 5 axes of freedom as the imaging instrument. Microgrippers or other tools mounted at the end of a linear motion feed through device having a motion resolution of about 10 nanometers are used as the manipulator. All of the assembly features are located inside of a vacuum or operating chamber to permit operation of the SEM imaging system. A variety of other auxiliary devices that support the MEMS assembly and testing system are also included to enhance the capabilities thereof.

8 Claims, 3 Drawing Sheets

MICROELECTROMECHANICAL SYSTEM ASSEMBLY AND TESTING DEVICE

This application is a continuation-in-part of U.S. patent application Ser. No. 09/897,304 filed Jul. 2, 2001 and copending herewith.

FIELD OF THE INVENTION

The present invention relates to a device for the assembly of microelectromechanical systems (MEMS) and more particularly to such a device that is also useful in micro-testing applications.

BACKGROUND OF THE INVENTION

Assembly of MEMS is recognized as difficult for three principal reasons. First, the optical imaging methods commonly used to image small MEMS parts during assembly lack sufficient resolution and depth of field to make accurate imaging of the very small parts practical. Secondly, the parts undergoing assembly are usually manipulated with a micromanipulator equipped with a small set of grippers. The conventional micromanipulator has barely the control necessary for assembly of small mechanical and electromechanical parts. Thirdly, most light microscopes do not have stages of sufficient axes of freedom to manipulate the device so that it is placed properly for precise placement of parts by the grippers located on the micromanipulator.

U.S. Pat. No. 5,559,329 issued Sep. 24, 1996 describes an apparatus for measuring the interfacial properties of fiber-matrix composites. The apparatus includes a linear motion feedthrough for pushing an indentor on a fiber end, a load cell for sensing indentor load and a scanning electron microscope (SEM) for magnifying the material in order to align the indentor with a fiber end undergoing testing. The SEM includes a vacuum chamber for housing the indentor, the load cell and a hot stage module. Data acquisition and recording devices as well as an imaging computer for recording images of the materials during testing are also described.

OBJECT OF THE INVENTION

It is an object of the present invention to relate the capabilities of the devices described in the foregoing U.S. Pat. No. 5,559,329 to the field of MEMS assembly through the presentation of a novel MEMS assembly device that utilizes the general approach of this patent.

It is another object of the present invention to provide an apparatus that broadens the applicability of such devices to other testing applications.

SUMMARY OF THE INVENTION

According to the present invention there is provided a novel MEMS assembly and testing system that utilizes a scanning electron microscope (SEM) typically having 5 axes of freedom as the imaging instrument. This imaging instrument has a resolution and depth of focus about 100 times greater than currently used visible light imaging systems. Microgrippers or other tools mounted at the end of a linear motion feed through device having a motion resolution of about 10 nanometers are used as the manipulator and for the attachment of various testing tools. All of the assembly and testing features are preferably located inside of a vacuum chamber to permit optimum operation of the SEM imaging system. A variety of other auxiliary devices that support the MEMS assembly and testing system are also included to enhance the capabilities thereof.

DETAILED DESCRIPTION

Figure 1:
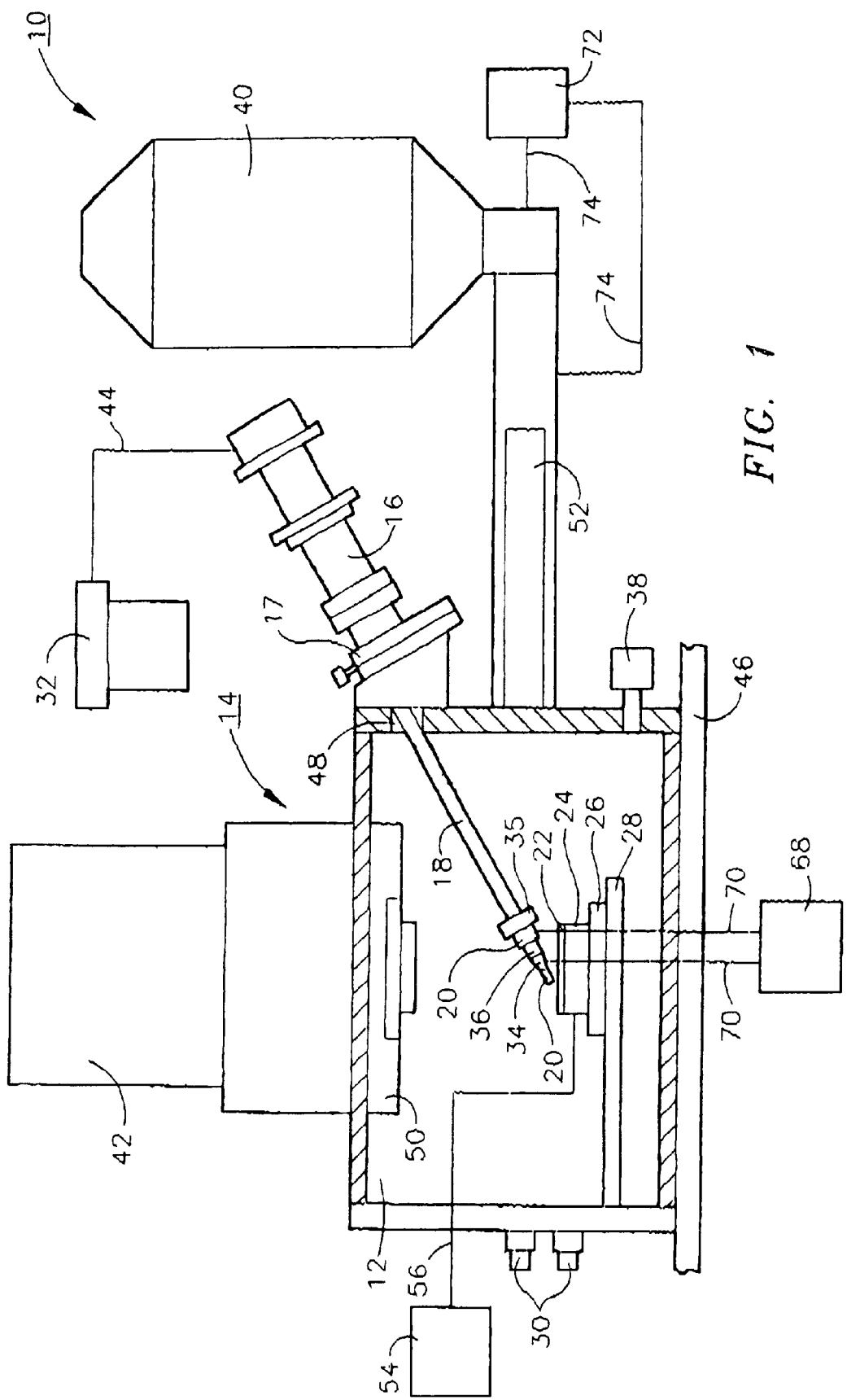
FIG. 1 is a schematic diagram of the MEMS assembly device of the present invention.

Referring now to FIG. 1, the MEMS assembly device 10 of the present invention comprises: a vacuum chamber 12, an SEM 14, a linear motion feedthrough device 16, connected via a shaft 18 to a microgripper or other suitable tool as described hereinafter 20 and including an alignment guide 17, an associated assembly/testing stage 22, a hot stage heater 24, an SEM stage 26 and a stage platform 28. The various other elements of MEMS assembly device 10 that support the forgoing essential elements include: stage controls 30 that provide control of stage platform 28 movement in the x, y, and z directions as well as permit tilting and rotation of stage platform 28 and associated assembly/testing stage 22 and SEM stage 26, linear motion feedthrough controller 32, acoustic emission sensor 34, load cell 36, piezoelectric positioner 35, vacuum gauge 38, X-ray microanalysis system 40 and SEM column 42. The roles of these various elements and devices will be explained more fully below.

A suitable linear motion feedthrough 16 is manufactured by Huntington Mechanical Laboratories as model MFL-275-4. Linear motion feedthrough 16 is connected to feedthrough controller 32 by cable 44. A suitable controller 32 is manufactured by Huntington Laboratories and includes a model MLC-1 indexer and a model ssp-500 hand held programmer. Such a feedthrough device provides a 20 pound load force capacity and a minimum drive velocity of about 0.127 $\mu$m/s or about 7.62 $\mu$m/min. This load force capacity and relatively slow drive speed are suitable for MEMS assembly operations. Linear motion feedthrough device 16 can also be equipped to activate a buzzer or other audible alarm whenever microgripper (or other suitable tool) 20 contacts a conductive surface. Such a modification can be helpful when approaching a surface or part very slowly. It is typically provides an earlier warning of contact than the load cell described hereinafter and is somewhat more reliable than the acoustic emission sensor described below for determining when a surface has been contacted. The use of a variety of redundant systems of this type to provide feedback regarding various situations encountered during an assembly operation is highly desirable and preferred.

SEM 14 includes vacuum chamber 12. This provides an excellent inert environment that assures that no contamination due to dust or other contaminants occurs. Vacuum chamber 12 is preferably mounted on a vibration isolation table 46 that dampens out external vibrations for even greater accuracy in the assembly operation.

Vacuum chamber 12 also houses a linear motion feedthrough shaft 18 microgrippers 20, load cell 36, acoustic emission sensor 34 and a piezoelectric positioner 35, as well as the various stages, assembly 22, hot stage 24, and SEM 26 and platform 28. Alignment guide 17 aligns feedthrough shaft 18 through a passageway in vacuum chamber 12.

A suitable SEM 14 is one previously manufactured by Cambridge as Stereoscan 90, Model B includes a backscatter electron detector 50, a secondary electron detector 52 as well as X-ray microanalysis system 40. X-ray microanalysis system 40 includes a digital imaging computer 72 that is interconnected with secondary electron detector 52 and X-ray microanalysis system 40 via cables 74 and running suitable image analysis and display software. A suitable digital imaging computer 72 can be any of the well known such devices such as a 486 or better PC. Computer 72 is used to acquire, record, transmit and view the assembly operation. Imaging in an SEM is also advantageous in that exposed conductors when under power image significantly brighter under and SEM thereby allowing an operator to readily check circuitry during operation.

Acoustic emission sensor 34 mounted on feedthrough shaft 18 is one form, in addition to optical imaging, for sensing contact between two parts being assembled within vacuum chamber 12 with microgrippers 20. The sound of contact between two parts is readily detected by such a device and provides an additional sensory perception of activity occurring within vacuum chamber 12 during assembly. A suitable acoustic emission sensor is manufactured by Physical Acoustics Corporation as model μ30. Alternatively, acoustic emission detector 34 could be mounted on SEM stage 26.

Locating and positioning of parts in the assembly is preferably performed in two primary ways. The "shop floor" or "assembly area" can be precisely moved using the X, Y, and Z tilt and rotate movements of SEM 14. Alternatively, using piezoelectric positioner 35 connected to linear motion feedthrough device 16 the X, Y, Z movements of microgrippers 20 (or another suitable tool) can be performed.

Suitable piezoelectric positioning devices 35, sometimes referred to as "nanopositioners", are commercially available from Polytec PI, Inc., 23 Midstate Drive, Suite 212, Auburn, Mass. 01501 as models P-280, P-281 and P-282 XY and XYZ PZT Flexure NanoPositioners.

Similarly, load cell 36 connected to the linear axis of feedthrough shaft 18 within vacuum chamber 12 permits careful control of various "pushing" or "pulling" operations occurring during an assembly or testing operation by providing feed back to the operator as individual parts as inserted into one another or other pressure sensitive operations are performed. A suitable load cell is manufactured by Sensotec as Model 31 that can be fitted with a variety of sensing heads ranging in capacity from about one or two pounds up to about 25 pounds.

Both load cell 36 and acoustic emission sensor 34 are monitored by a suitable detection device 68 such as a computer connected to these devices via cables 70.

Vacuum gauge 38 provides the means for monitoring the pressure within vacuum chamber 12. Such devices are well known in the art and commonly associated with vacuum chambers of the type utilized in conjunction with SEMs.

Figure 2:
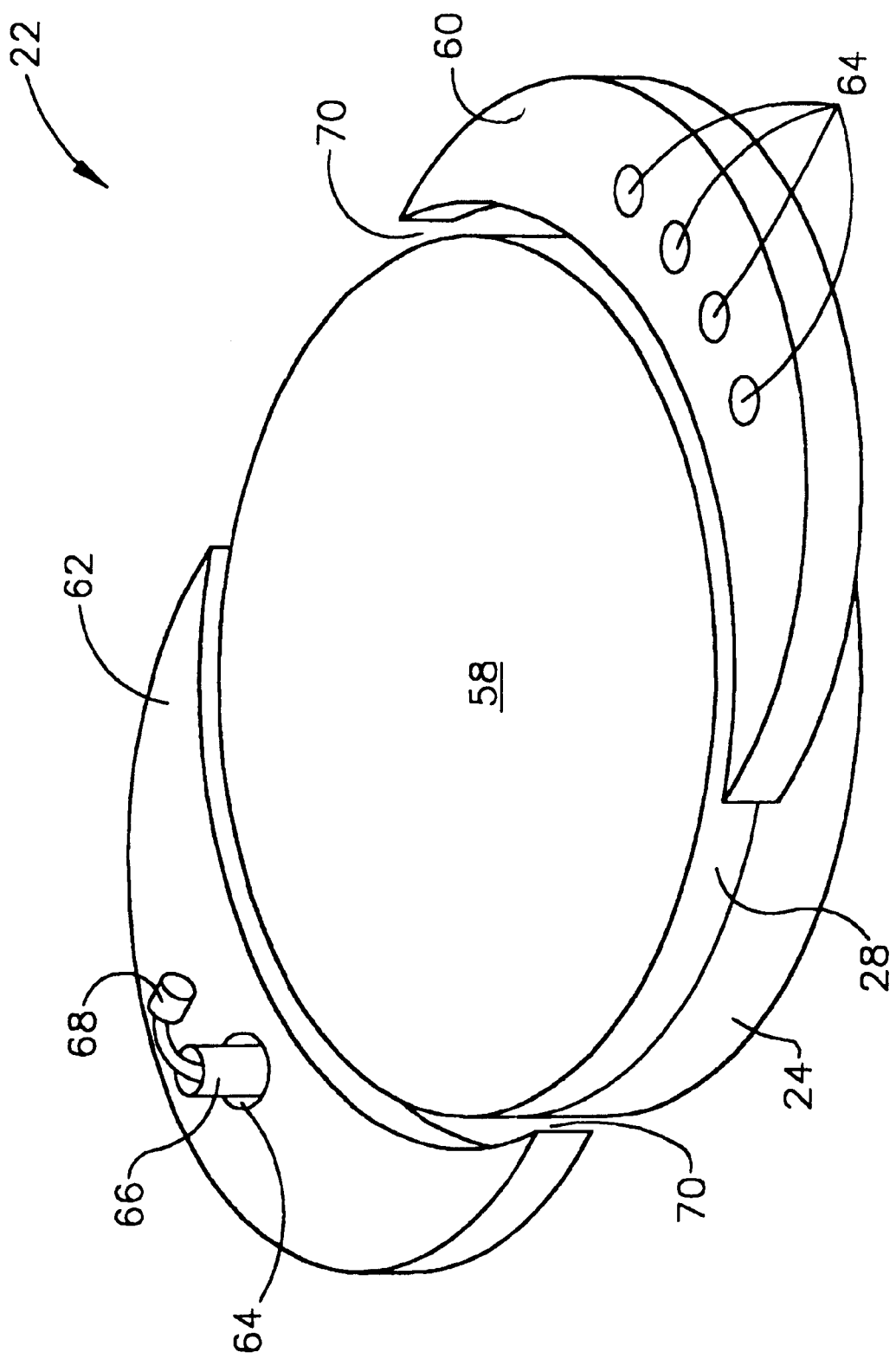
FIG. 2 is perspective representation of the assembly stage of the MEMS assembly device of the present invention.

Referring now to FIG. 2 that depicts schematically the MEMS assembly/testing stage 22 of the apparatus of the present invention, MEMS assembly stage 22 includes a hot stage heater 24 such as that manufactured Oxford Instruments Limited as model H1005 controlled by a suitable digital temperature controller (not shown). The hot stage heater 24 permits careful and accurate control of temperature on the "shop floor" or assembly and testing area 58, i.e. the area atop SEM sample holder or stage 28. Additionally, the presence of hot stage 24 permits heating of parts being assembled to cure, for example, thermoset polymers or to braze or solder parts. Elevated temperature testing of parts, materials or assemblies or "burn in" temperature operating conditions of electronic or mechanical assemblies can also be accomplished with this configuration. The temperature of hot stage 24 is monitored and controlled by hot stage controller 54 connected to hot stage 24 via cable 56.

Mounted about the periphery of SEM stage 26 are one or more holders, two in number in the accompanying drawings, identified by the numerals 60 and 62. Each of holders 60 and 62 includes apertures or other containment devices such as apertures 64 for placement of parts necessary in the microassembly operation. Another use of apertures 64, as shown in the case of holder 62 in accompanying FIG. 2 is for the placement of, for example, a container 66 of a vacuum stable adhesive and an applicator 68 therefor. The placement of parts, adhesives etc. in these locations allows ready accessibility thereto during assembly operations. Unless it is desired that "tools", parts or other elements placed in apertures 64 be heated prior to use, it is highly desirable that an air gap 70 or some suitable insulation layer be provided between assembly stage 58 and holders 60–62.

The MEMS assembly and testing device described herein can be equipped with a wide array of additional imaging methods including: secondary electron imaging, that provides imaging of the structure being assembled; backscatter imaging that can be set to vary contrast with respect to atomic number; specimen current imaging that identifies electrically conductive pathways; electron fluorescent imaging that images based upon the sample's ability to give off light while being excited by an electron beam as well as X-ray microanalysis that can provide elemental analysis of virtually any location being imaged. A light microscope can also be incorporated.

As will be apparent to the skilled artisan, a wide variety of "tools" can be substituted for the microgrippers referred to hereinabove and commonly used in MEMS assembly operations. For example, voltage probes, punches, hooks, cutting instruments etc. can all be used in place of the microgripper 20 and such additional "tools" can be stored in, for example, apertures 64 in holders 62 of the accompanying drawings or other similar retaining means.

In use, the appropriate "tools", parts and other materials are located in holders 60 and 62 or upon assembly area 58 and a microgripper or other suitable assembly or testing device attached to feedthrough shaft 18. The vacuum chamber is then sealed and evacuated in accordance with normal procedures. Once scanning is commenced, the initial MEMS part (generally attached to the assembly stage surface 58) is brought to the appropriate location and orientation through manipulation of stage controls 30. Linear motion feedthrough device 16 is slowly brought into view. Careful movement of both the stage controls 30 and the linear motion feedthrough device 16 allows for the lifting of various components from holders 60 and 62 and permits them to be placed precisely in their appropriate assembly locations.

Attachment of the various parts being assembled can be achieved in a variety of ways, for example, by friction fit, through the use of vacuum stable thermoset or thermoplastic polymers, heat, electron beam or UV cured, or by soldering or brazing.

During assembly, the force used to press or hold the parts in place can be measured by load cell 36 and acoustic emission sensor 34 can be used to provide an audible confirmation of contact between parts, as can the previously described conductive path technique.

As will be further apparent to the skilled artisan, more than one linear motion feedthrough device 16 could be installed in a single MEMS assembly and testing device according to the present invention.

Among the myriad of sensors and machines that MEMS assembly device 10 could be used to assemble or test are included, but not limited to: accelerometers such as those used in airbags, automobile control, pacemakers, games, automotive brakes, image stabilizers and other inertial measurement systems, so-called laboratory on a chip type sensors; flow sensors, optical switches, projection and handheld displays; pressure sensors such as those developed for tire pressure and other automotive and industrial applications; miniature read/write heads; cell phone parts; MEMS devices for radar applications and steerable antennas; microrelays; and a variety of sensors to measure such physical properties as humidity, temperature, vibration etc.

While a significant advantage of MEMS assembly device 10 of the present invention is that assembly of prototype and production micro-devices can be made manually guided by the high resolution and depth of focus of the SEM, the device is also capable of being partly or entirely automated for high volume production and testing.

Through the use of appropriate tools, MEMS device 10 is capable of being used to test virtually any material or device that can be attached to assembly stage 26 in tensile, creep, fatigue, shear, or compression loading. Among the tests possible is the measurement of properties of virtually any component manufactured in the MEMS scale range where the smallest dimension needed to be resolved is greater than about $0.05\mu$. This would include the testing of gears, posts, and other structural members. MEMS device 10 can also be used to measure the mechanical properties of coatings or films with such tests as scratch tests, impact tests and hardness tests. Such testing would not only disclose the information about the strength of such materials, but it would also provide micromechanical information leading to a micromechanical understanding of the mode of failure which is sometimes the most valuable piece of information. For example, placing a microhardness indentor in place of the microgrippers described above allows for the measurement of microhardness while observing the sample at the SEM resolution. Additionally, the fine control possible with MEMS device 10 will allow the measurement of both microhardness and nanohardness. Furthermore, all such tests can be done at elevated temperature and all while imaging the test while it is in progress to detect minute changes such as detecting if failure occurs through the formation of a crack at a load point rather than through deformation. Other tests that can be performed include a variety of fiber tests such as 3-point and 4-point bend tests, crush tests, and tensile tests. Abrasion testing can also be performed by continually increasing the load placed by an indentor while simultaneously moving the sample beneath the indentor all while the micromechanics of the test are being observed.

Figure 3:
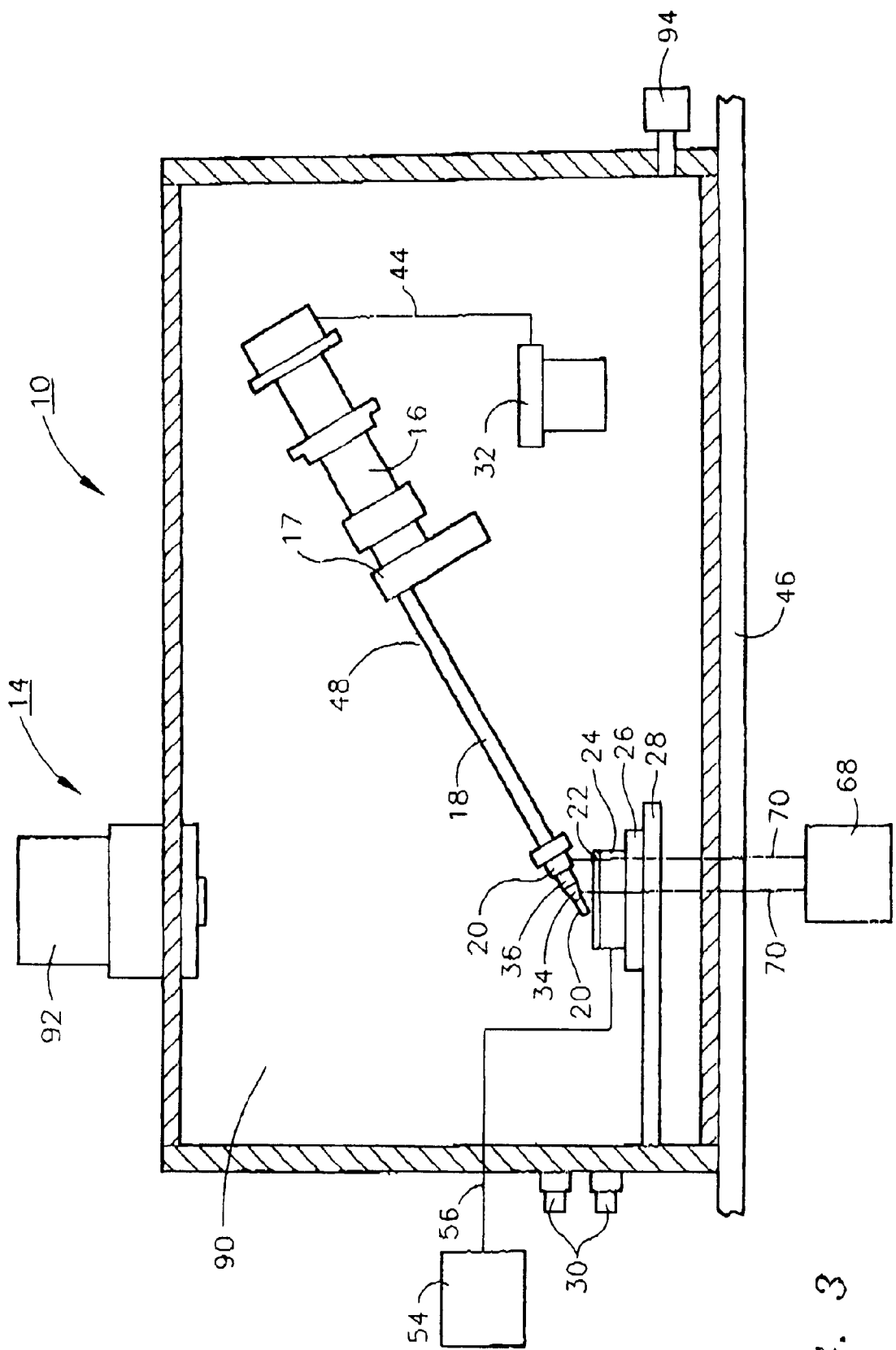
FIG. 3 is a schematic diagram of an alternative embodiment of the device of the present invention that is particularly useful in the micro-testing of materials.

Referring now to FIG. 3 that depicts an alternative embodiment of the device of the present invention that is particularly suited to testing applications at the micro level, it will be noted that in this embodiment the apparatus of the present invention: 1) does not include microanalysis system 40; and 2) linear motion feedthrough device 16 is located inside of what is now an operating chamber 90 that can, but need not be, evacuated. Non-evacuated operating chamber 90 can be used because SEM 42 shown in FIG. 1 has been replaced with an environmental SEM 92 that can be operated under a relatively small partial pressure, but not a vacuum as is well known in the art. Additionally, "tool" 20 may now be, for example a tensile gripper of the type conventionally used to perform tensile tests, in the instant case at the micro level, and linear feedthrough device 16 now can, but need not be, located inside of operating chamber 90. The other essential elements of device 10 are retained including: shaft 18, alignment guide 17, stage 22, hot stage heater 24, SEM stage 26 and platform 28. For the performance of tests such as tensile tests operating chamber 90 may, but need not necessarily be evacuated as the presence of a vacuum is not as critical for such testing applications as in the case of micro-assembly and when environmental SEM 92 is used. This alleviates the demands placed upon the system if linear feedthrough device 16 is located within vacuum chamber 12 of FIG. 1, although linear feedthrough device 16 can also be located within vacuum chamber 12 in the embodiment shown in FIG. 1 at some additional cost. Vacuum gauge 38 is replaced with a simple pressure gauge 94 to monitor partial pressure within operating chamber 90 to permit operation of environmental SEM 92.

The testing device just described finds particular utility in testing applications at the micro level such as those for tensile tests and the like that could be used in alloy development Since tests such as tensile tests do not require the sophisticated X-ray analysis that is required in micro-assembly operations, the X-ray microanalysis system becomes superfluous in such applications and can be eliminated. Similarly, the X-ray analysis system may also be dispensed with in certain micro assembly operations where such additional capability is not necessary.

There have thus been described a variety of embodiments of an apparatus useful in the fabrication of MEMS devices as well as in the testing of materials at the micro level.

As the invention has been described, it will be apparent to those skilled in the art that the same may be varied in many ways without departing from the spirit and scope of the invention. Any and all such modifications are intended to be included within the scope of the appended claims.

What is claimed is:

1. A micro testing and assembly device comprising:
   A) a scanning electron microscope;
   B) an operating chamber having walls and within which said scanning electron microscope operates;
   C) a linear motion feedthrough device that includes a linear motion feedthrough device shaft having a terminal end;
   D) attached to the terminal end and within said operating chamber a tool;
   E) in the vicinity of said tool and controlled via stage controls a manipulable platform;
   F) a scanning electron microscope stage mounted on said stage platform; and
   G) a testing/assembly stage mounted on said scanning electron microscope stage.

2. The micro testing and assembly device of claim 1 wherein said linear motion feedthrough device is located within said operating chamber.

3. The micro testing and assembly device of claim 1 wherein said tool is a microgripper.

4. The micro testing and assembly device of claim 1 further including intermediate said scanning electron microscope stage and said testing stage a hot stage for controllably heating said assembly stage and any parts or materials located thereon.

5. The micro testing device of claim 1 further including intermediate said tool and said terminal end, a load cell for the measurement of load applied to said tool during assembly or testing.

6. The micro testing and assembly device of claim 1 further including an acoustic emission sensor for detecting contact between parts being assembled or tested.

7. The micro testing and assembly device of claim 1 further including an alignment guide for said linear motion feedthrough device.

8. The micro testing and assembly device of claim 1 further including a piezoelectric positioner located intermediate said linear motion feedthrough device shaft and said tool.

\* \* \* \* \*